US007205191B2

(12) United States Patent
Kobayashi

(10) Patent No.: US 7,205,191 B2
(45) Date of Patent: Apr. 17, 2007

(54) SEMICONDUCTOR INTEGRATED CIRCUIT AND METHOD OF DESIGNING THE SAME

(75) Inventor: Tsuguo Kobayashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 175 days.

(21) Appl. No.: 10/817,817

(22) Filed: Apr. 6, 2004

(65) Prior Publication Data

US 2005/0001271 A1 Jan. 6, 2005

(30) Foreign Application Priority Data

May 14, 2003 (JP) ............................. 2003-136135

(51) Int. Cl.
*H01L 21/8244* (2006.01)
(52) U.S. Cl. .................................... 438/238
(58) Field of Classification Search ................. 438/238
See application file for complete search history.

(56) References Cited

U.S. PATENT DOCUMENTS 5,929,469 A * 7/1999 Mimoto et al. ............. 257/208

6,026,225 A * 2/2000 Iwasaki ....................... 716/10

FOREIGN PATENT DOCUMENTS

| JP | 60-140853 | 7/1985 |
| JP | 03-012963 | 1/1991 |
| JP | 10-154756 | 6/1998 |
| JP | 2000-22084 | 1/2000 |
| JP | 2001-168291 | 6/2001 |

* cited by examiner

*Primary Examiner*—Roy Potter
(74) *Attorney, Agent, or Firm*—Oblon, Spivak, McClelland, Maier & Neustadt, P.C.

(57) ABSTRACT

According to the present invention, a semiconductor integrated circuit having a cell region in which a plurality of MOS transistors forming at least one cell are placed; and first and second power lines placed along one direction in a peripheral portion of the cell region, wherein in the cell region, gate grids for defining a first pitch in the one direction and pin grids for defining a second pitch in the one direction are set, gate electrodes of the MOS transistors are placed in accordance with the gate grids, and an interconnection layer is placed in accordance with the pin grids.

7 Claims, 9 Drawing Sheets

US 7,205,191 B2

1

SEMICONDUCTOR INTEGRATED CIRCUIT AND METHOD OF DESIGNING THE SAME

CROSS REFERENCE TO RELATED APPLICATION

This application is based upon and claims benefit of priority under 35 USC 119 from the Japanese Patent Application No. 2003-136135, filed on May 14, 2003, the entire contents of which are incorporated herein by reference.

BACKGROUND OF THE INVENTION

The present invention relates to a semiconductor integrated circuit and a method of designing the same and, more particularly, to a semiconductor integrated circuit suited to laying out standard cells.

Recently, the circuit scale of semiconductor integrated circuits is abruptly increasing, and demands for shortening the development time are also increasing.

Accordingly, a method has been extensively used which does not cause a circuit designer to plan and design a circuit configuration for realizing logic by himself or herself, but designs a circuit block for implementing a desired function by performing logic synthesis, placement, and routing by using software for performing logic synthesis.

In designing circuit blocks forming a semiconductor device as described above, a standard cell is used to perform logic synthesis and implement the circuit blocks by using software on the basis of functionally described design data.

A standard cell is a small-scale circuit (to be referred to as a cell hereinafter) preformed to realize basic logic, and prepared for each of a plurality of types of logic. In addition, even for single logic, a plurality of cells having different load driving forces, i.e., different sizes are prepared to control various loads. A set of a plurality of types of cells is called a standard cell library.

FIG. 7 is a plan view showing a conventional standard cell layout. In a surface portion of a semiconductor substrate, an N-type well region N1 and P-type well region P1 are placed. In the N-type well region N1, a gate electrode GE1 is formed on the substrate. On the two sides of the gate electrode GE1, a P-type impurity is ion-implanted to form P-type diffusion layers, thereby forming a PMOS transistor PM1. In the P-type diffusion layers, a source electrode SE1 is formed on a source region, and a drain electrode DE1 is formed on a drain region.

Likewise, in the P-type well region P1, the gate electrode GE1 is so formed as to extend, and an N-type impurity is ion-implanted on the two sides of the gate electrode GE1 to form N-type diffusion layers, thereby forming an NMOS transistor NM1. In the N-type diffusion layers, a source electrode SE2 is formed on a source region, and a drain electrode DE1 is formed on a drain region.

An N-type diffusion layer NS1 for fixing the substrate bias potential is placed in the end portion of the N-type well region N1, and a metal interconnection MW1 is placed around the N-type diffusion layer NS1. A P-type diffusion layer PS1 for fixing the substrate bias potential is placed in the end portion of the P-type well region P1, and a metal interconnection MW2 is placed around the P-type diffusion layer PS1. The source electrode SE1 is connected to the metal interconnection MW1, and the source electrode SE2 is connected to the metal interconnection MW2.

In the conventional device as described above, the diffusion layers and metal interconnections for applying the

2 substrate bias potential to the P- and N-type wells formed in the surface of the semiconductor substrate are placed in a standard cell.

As these diffusion layers for fixing the substrate bias, impurities are ion-implanted by using masks to form the N-type diffusion layer NS1 in the N-type well and the P-type diffusion layer PS1 in the P-type well. As micropatterning progresses, however, it is found that the design rule for impurity ion implantation makes micropatterning difficult to perform, compared to the design rule for MOS transistor formation and metal interconnection. This makes it difficult to decrease a width d11 of the power lines MW1 and MW2 so formed as to surround the N- and P-type diffusion layers NS1 and PS1, respectively, shown in FIG. 7, thereby failing further micropatterning.

In addition, pin grids which define the pitch of metal interconnections is conventionally used as a reference for laying out cells and metal interconnections. FIG. 8 shows the pitch of metal pins MP as a pin grid pitch MGP.

Unfortunately, pin grids are not suited to the cell layout, so intervals between a gate electrode GE11 of a P-channel MOS transistor PM11 and N-channel MOS transistor NM11, a gate electrode GE12 of a P-channel MOS transistor PM12 and N-channel MOS transistor NM12, and a gate electrode GE13 of a P-channel MOS transistor PM13 and N-channel MOS transistor NM13 do not match the pin grids. In fact, the layout is random.

Consequently, as shown in FIG. 9, intervals between the gate electrodes of MOS transistors placed in the upper and lower portions are different from each other. More specifically, intervals between a gate electrode GE21 of a P-channel MOS transistor PM21 and N-channel MOS transistor NM21, a gate electrode GE22 of a P-channel MOS transistor PM22 and N-channel MOS transistor NM22, and a gate electrode GE23 of a P-channel MOS transistor PM23 and N-channel MOS transistor NM23 placed in the upper portion are different from intervals between a gate electrode GE24 of an N-channel MOS transistor NM24 and P-channel MOS transistor PM24, a gate electrode GE25 of an N-channel MOS transistor NM25 and P-channel MOS transistor PM25, a gate electrode GE26 of an N-channel MOS transistor NM26 and P-channel MOS transistor PM26, and a gate electrode GE27 of an N-channel MOS transistor NM27 and P-channel MOS transistor PM27 placed in the lower portion.

This layout difference between the gate electrodes of the upper and lower transistors poses the following problems.

Presently, in patterning the gate electrodes of MOS transistors by using a photomask, the phase of exposure light is shifted to increase the degree of micropatterning. Under the circumstances, if the gate electrodes of the upper and lower transistors are placed at irregular intervals as shown in FIG. 9, the degree of micropatterning is largely limited by the design rule.

FIG. 10 shows a diffusion layer D1 and gate electrodes G1 and G2 of transistors placed in the upper portion, and a diffusion layer D2 and gate electrode G3 of a transistor placed in the lower portion. Mask patterns MP1, MP2, and MP3 are placed in the upper portion as photomasks for patterning the upper gate electrodes G1 and G2. Mask patterns MP4 and MP5 are placed as photomasks for patterning the lower gate electrode G3. The positions of the upper gate electrodes G1 and G2 and the lower gate electrode G3 are different from each other.

Assuming that the first phase of exposure light comes in contact with the end face of the upper mask pattern MP1, the second phase comes in contact with the mask pattern MP2 adjacent to the mask pattern MP1, and the first phase comes in contact with the mask pattern MP3 adjacent to the mask pattern MP2. To pattern gate electrodes, therefore, different phases of light must come in contact with adjacent mask patterns.

Unfortunately, the lower mask patterns MP4 and MP5 are positioned between the upper mask patterns MP1 and MP3, so the second phase of light comes in contact with both of these lower mask patterns. This makes patterning impossible. A difference between the upper and lower mask patterns produces this phase contradiction.

To prevent this phase contradiction, it is necessary to increase the spacings between the upper mask patterns MP1, MP2, and MP3 and between the lower mask patterns MP4 and MP5, and this increases the cell size.

References disclosing semiconductor integrated circuits using the conventional standard cell are as follows.

Japanese Patent Laid-Open No. 10-154756
Japanese Patent Laid-Open No. 2001-168291
Japanese Patent Laid-Open No. 2000-22084

As described above, a region for supplying the substrate potential conventionally interferes with micropatterning. In addition, although the cell placement is based on pin grids, the placement of the gate electrodes of MOS transistors is irregular. As a consequence, the cell area increases by large limitations on the design rules.

SUMMARY OF THE INVENTION

According to one aspect of the present invention, there is provided a semiconductor integrated circuit comprising:
a cell region in which a plurality of MOS transistors forming at least one cell are placed; and
first and second power lines placed along one direction in a peripheral portion of said cell region,
wherein in said cell region, gate grids configured to define a first pitch in said one direction and pin grids for defining a second pitch in said one direction are set,
gate electrodes of said MOS transistors are placed in accordance with the gate grids, and
an interconnection layer is placed in accordance with the pin grids.

According to one aspect of the present invention, there is provided a method of designing a semiconductor integrated circuit, comprising:
providing a cell region in which a plurality of MOS transistors forming at least one cell are placed, setting gate grids for defining a first pitch in one direction and pin grids for defining a second pitch in the one direction;
placing first and second power lines along the one direction in a peripheral portion of the cell region;
placing the MOS transistors such that gate electrodes are positioned on the gate grids; and
placing an interconnection layer in accordance with the pin grids.

DESCRIPTION OF THE EMBODIMENTS

Embodiments of the present invention will be described below with reference to the accompanying drawings.

(1) First Embodiment

Figure 1:
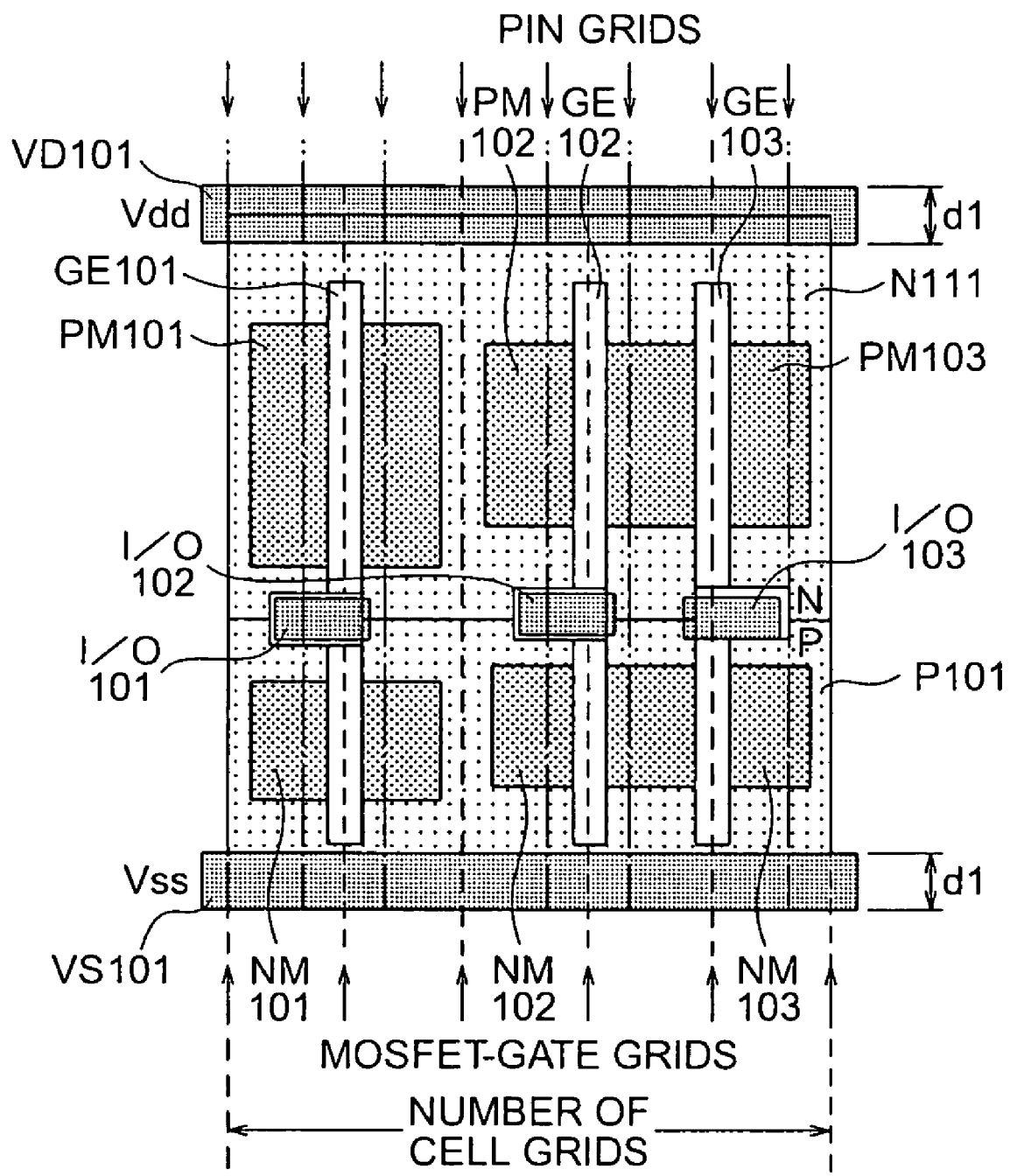
FIG. 1 is a plan view showing the arrangement of a semiconductor integrated circuit according to the first embodiment of the present invention.

FIG. 1 is a plan view showing the arrangement of a semiconductor integrated circuit according to this embodiment.

An N-type well region N101 and P-type well region P101 are placed in a surface portion of a semiconductor substrate. A power supply voltage Vdd line VD101 and ground voltage Vss line VS101 are placed above and below, respectively, in FIG. 1, the pair of the N-type well region N101 and P-type well region P101.

In the vertical direction of FIG. 1, pin grids as a reference of a metal pin pitch are indicated by the alternate long and short dashed lines, and gate grids as a reference of the pitch of the gate electrodes of MOS transistors are indicated by the dotted lines. In this embodiment, the ratio of the pin grid pitch to the gate grid pitch is set at 2:3.

In the N-type well region N101, a gate electrode GE101 is formed on the substrate, and a P-type impurity is ion-implanted on the two sides of this gate electrode to form P-type diffusion layers, thereby forming a PMOS transistor PM101.

Similarly, in the N-type well region N101, gate electrodes GE102 and GE103 are formed, and a P-type impurity is ion-implanted on the two sides of each of these gate electrodes to form P-type diffusion layers, thereby forming PMOS transistors PM102 and PM103.

A source electrode for connecting a source region in the P-type diffusion layers and the power supply voltage Vdd terminal VD101, a source electrode for connecting a source region in N-type diffusion layers (to be described later) and the ground voltage, and a drain electrode for connecting a drain region in the P-type diffusion layers and a drain region in the N-type diffusion layers are not illustrated in FIG. 1.

In the P-type well region P101, the gate electrode GE101 is so formed as to extend, and an N-type impurity is ion-implanted on the two sides of this gate electrode to form N-type diffusion layers, thereby forming an NMOS transistor NM101.

In addition, in the P-type well region P101, the gate electrodes GE102 and GE103 are so formed as to extend, and N-type diffusion layers are formed on the two sides of each of these gate electrodes, thereby forming NMOS transistors NM102 and NM103.

On the boundary line between the N-type well region N101 and P-type well region P101, a metal terminal is formed as an input/output terminal I/O101 so as to be connected to the gate electrode GE101.

Likewise, on the boundary line between the N-type well region N101 and P-type well region P101, metal terminals are formed as input/output terminals I/O102 and I/O103 so as to be connected to the gate electrodes GE102 and GE103, respectively.

As described above, the first characteristic feature of this embodiment is that the MOS transistors PM101 to PM103 and NM101 to NM103 forming the circuit are normalized when they are placed such that the gate electrodes GE101 to GE103 are placed on the gate grids.

By this normalization, it is possible to eliminate the problems concerning, e.g., the processing accuracy in the photomasks, lithography step, and etching step, resulting from the nonuniformity of the conventional gate electrode placement, and to improve the degree of integration.

The second characteristic feature of this embodiment is that the input/output terminals I/O101 to I/O103 formed between the plurality of MOS transistors are placed by taking account of differences between the gate grids and pin grids. More specifically, the gate electrode GE101 is placed on a gate grid but is not placed on a pin grid. In this case, the input/output terminal I/O101 connected to the gate electrode GE101 is so placed as to extend over the gate grid on which the gate electrode GE101 is placed and one of two pin grids closest to this gate grid. In this embodiment, therefore, MOS transistors and input/output terminals can be regularly placed. This helps reduce the element area by preventing the formation of an unnecessary element area.

(2) Second Embodiment

Figure 2:
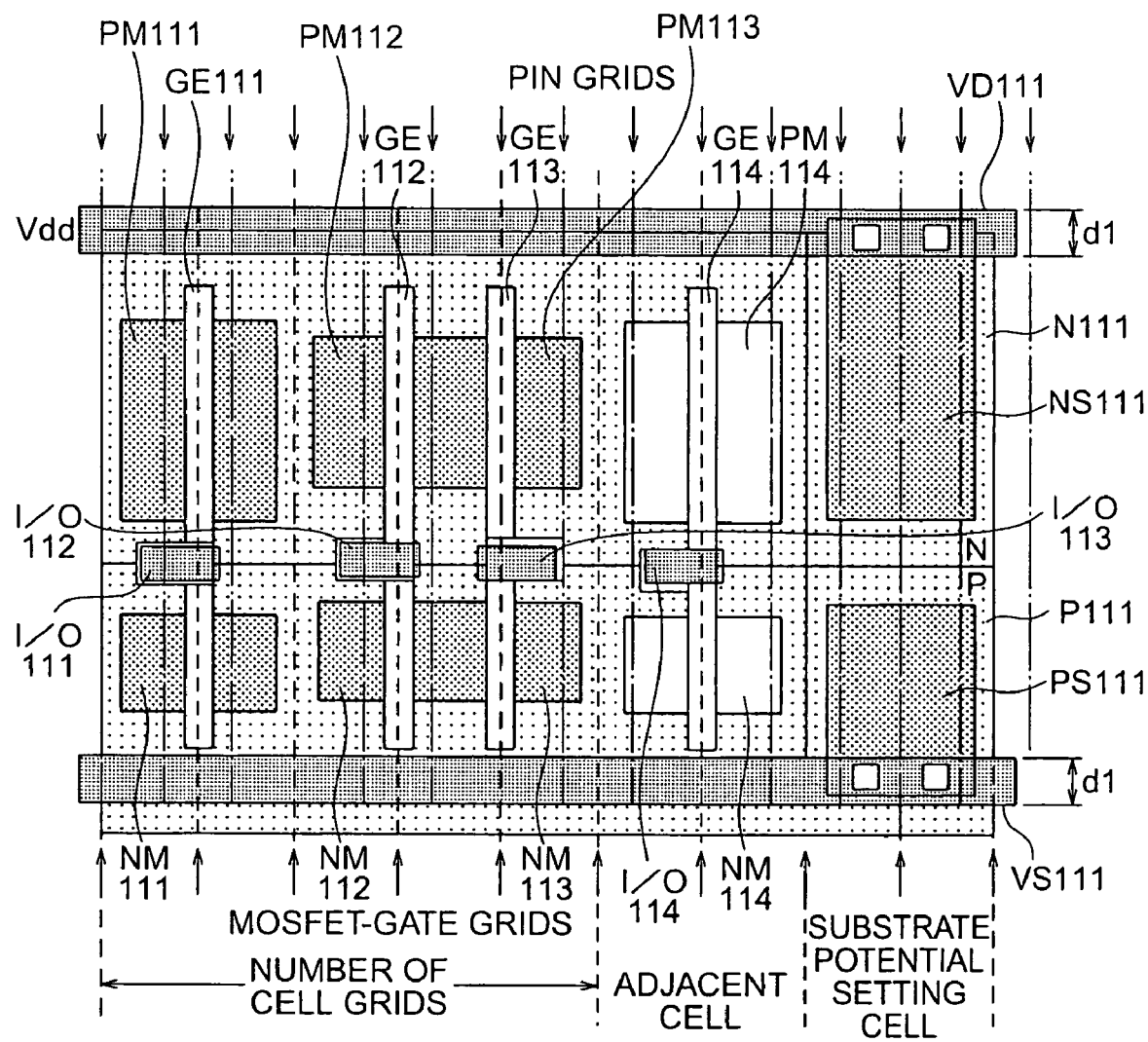
FIG. 2 is a plan view showing the arrangement of a semiconductor integrated circuit according to the second embodiment of the present invention.

FIG. 2 is a plan view showing the arrangement of a semiconductor integrated circuit according to this embodiment.

This embodiment is characterized in that two adjacent cells are placed, and impurity diffusion layers are additionally placed as cells for setting the substrate potential.

An N-type well region N111 and P-type well region P111 are placed in a surface portion of a semiconductor substrate. A power supply voltage Vdd line VD111 and ground voltage Vss line VS111 are placed above and below, respectively, in FIG. 2, the pair of the N-type well region N111 and P-type well region P111.

As in the first embodiment described above, in the vertical direction of FIG. 2, pin grids as a reference of a metal pin pitch are indicated by the alternate long and short dashed lines, and gate grids as a reference of the pitch of the gate electrodes of MOS transistors are indicated by the dotted lines. In this embodiment, as in the above embodiment, the ratio of the pin grid pitch to the gate grid pitch is set at 2:3.

In the N-type well region N111, a gate electrode GE111 is formed on the substrate, and P-type diffusion layers are formed on the two sides of this gate electrode to form a PMOS transistor PM111. Similarly, gate electrodes GE112, GE113, and GE114 are formed, and P-type diffusion layers are formed on the two sides of each of these gate electrodes to form PMOS transistors PM112, PM113, and PM114, respectively.

In the P-type well region P111, the gate electrodes GE111, GE112, GE113, and GE114 are so formed as to extend, and N-type diffusion layers are formed on the two sides of each of these gate electrodes to form NMOS transistors NM111, NM112, NM113, and NM114, respectively.

In this arrangement, a cell made up of the PMOS transistor PM114 and NMOS transistor NM114 is formed adjacent to cells made up of the PMOS transistor PM111 and NMOS transistor NM111, the PMOS transistor PM112 and NMOS transistor NM112, and the PMOS transistor PM113 and NMOS transistor NM113.

On the boundary line between the N-type well region N111 and P-type well region P111, input/output terminals I/O111 to I/O114 are so formed as to be connected to the gate electrodes GE111 to GE114, respectively.

In addition, in this embodiment, a substrate potential supply cell for applying a power supply voltage Vdd to the N-type well N111 and a ground voltage Vss to the P-type well P111 is formed in the same cell region as the MOS transistors. That is, an N-type impurity diffusion layer NS111 is placed in the N-type well 111 and electrically connected to the power supply voltage Vdd line VD111. Likewise, a P-type impurity diffusion layer PS111 is placed in the P-type well 111 and electrically connected to the ground voltage Vss line VS111.

Similar to the first embodiment described above, the first characteristic feature of this embodiment is that the MOS transistors PM111 to PM114 and NM111 to NM114 forming the circuit are normalized when they are placed such that the gate electrodes GE111 to GE114 are placed on the gate grids.

The second characteristic feature of this embodiment is that the input/output terminals I/O111 to I/O114 formed between the plurality of MOS transistors are placed by taking account of differences between the gate grids and pin grids. More specifically, the gate electrode GE111 is placed on a gate grid but is not placed on a pin grid. In this case, the input/output terminal I/O111 connected to the gate electrode GE111 is so placed as to extend over the gate grid on which the gate electrode GE111 is placed and one of two pin grids closest to this gate grid.

In this embodiment, therefore, MOS transistors and input/output terminals can be regularly placed. This helps reduce the element area by preventing the formation of an unnecessary element area.

Figure 7:
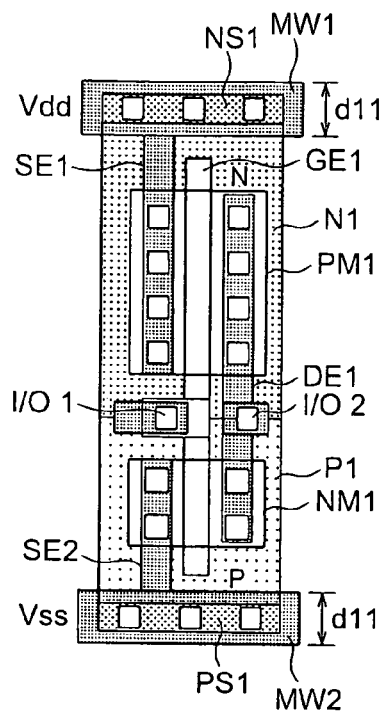
FIG. 7 is a plan view showing the arrangement of a conventional semiconductor integrated circuit.
Figure 8:
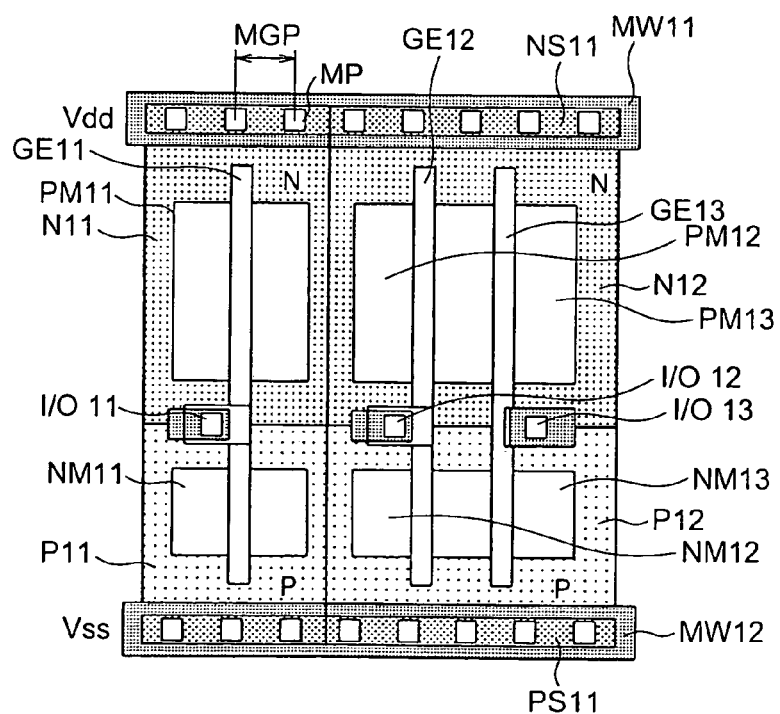
FIG. 8 is a plan view showing the arrangement of another conventional semiconductor integrated circuit.
Figure 9:
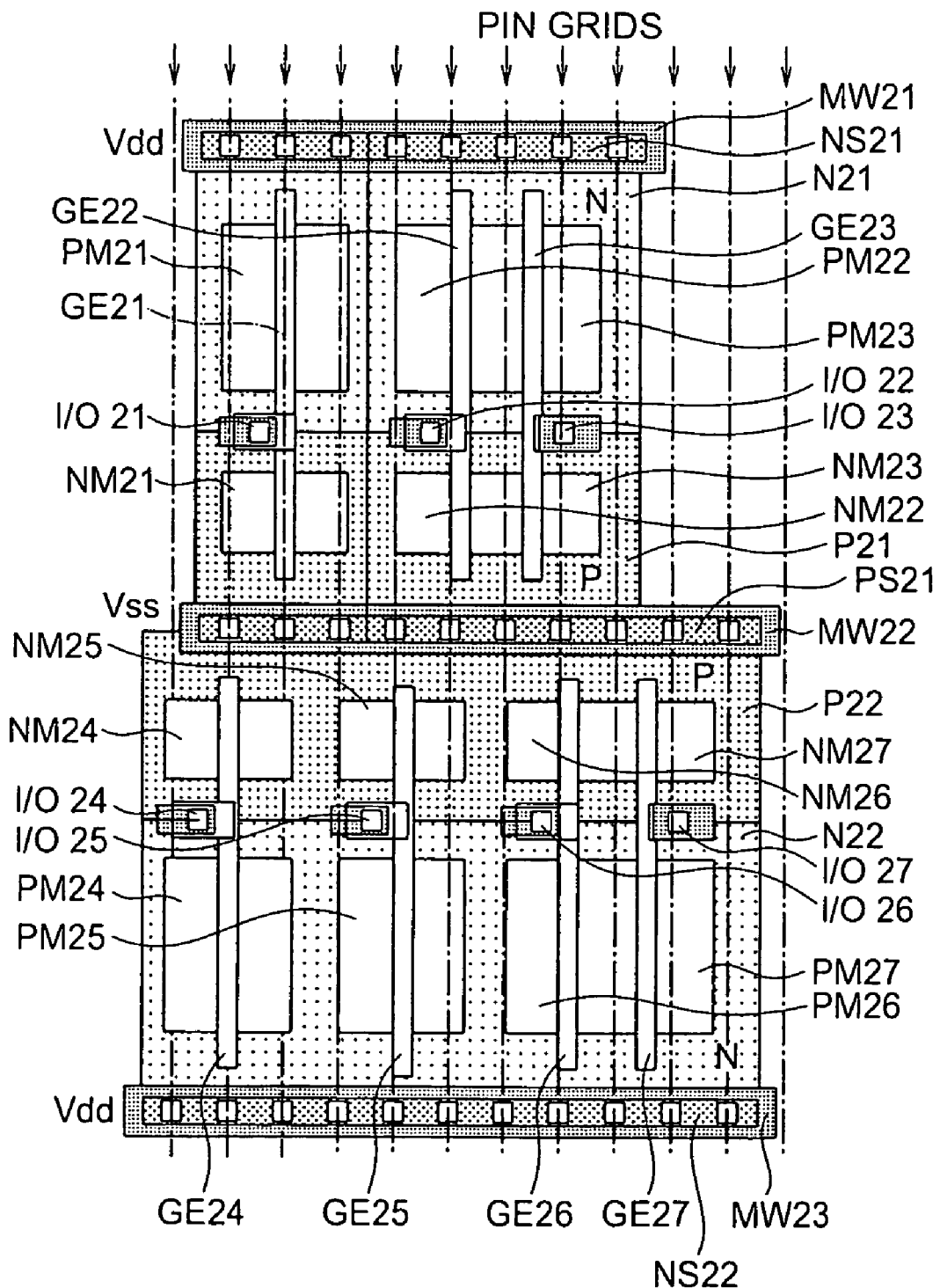
FIG. 9 is a plan view showing the arrangement of still another conventional semiconductor integrated circuit.
Figure 10:
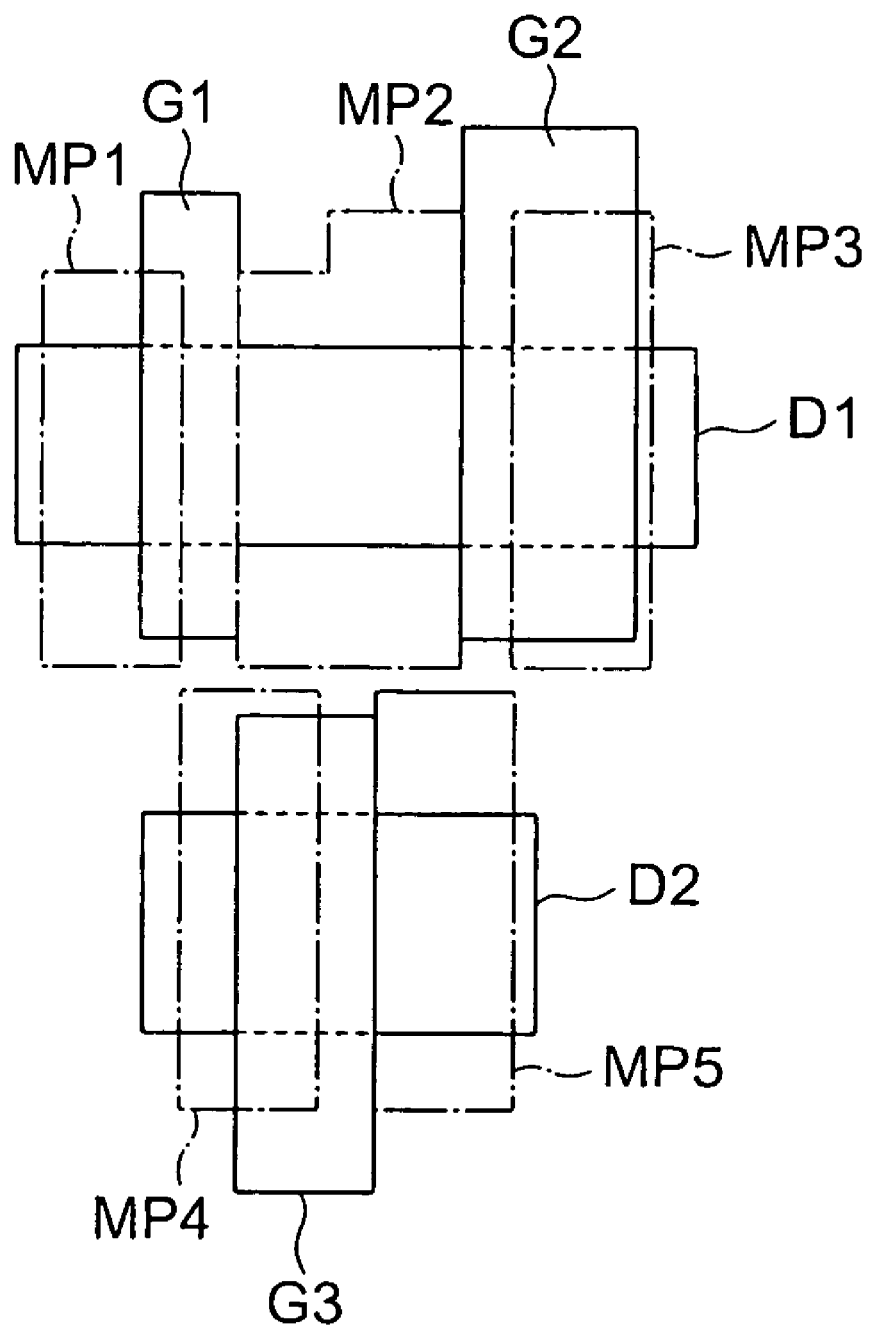
FIG. 10 is a plan view for explaining the problem of phase contradiction in the conventional semiconductor integrated circuit.

Furthermore, the third characteristic feature of this embodiment is that the diffusion layers NS111 and PS111 for applying the substrate bias potential to the N-type well N111 and P-type well P111 are formed as substrate potential setting cells in the region in which the MOS transistors are placed. Conventionally, as explained earlier with reference to FIG. 7, the diffusion layer NS1 is formed in the power supply voltage Vdd line MW1 to apply the power supply voltage Vdd to the N-type well N1, and the diffusion layer PS1 is formed in the ground voltage Vss line MW2 to apply the ground voltage Vss to the P-type well P1. This makes it impossible to reduce the width d11 of the power supply voltage Vdd line MW1 and ground voltage Vss line MW2, thereby preventing micropatterning.

In contrast, in this embodiment, since such impurity diffusion layers for applying the substrate potential need not be formed in the power supply voltage Vdd line VD111 and ground voltage Vss line VS111, the width d1 can be made smaller than the conventional width d11, and this contributes to micropatterning of elements.

(3) Third Embodiment

Figure 3:
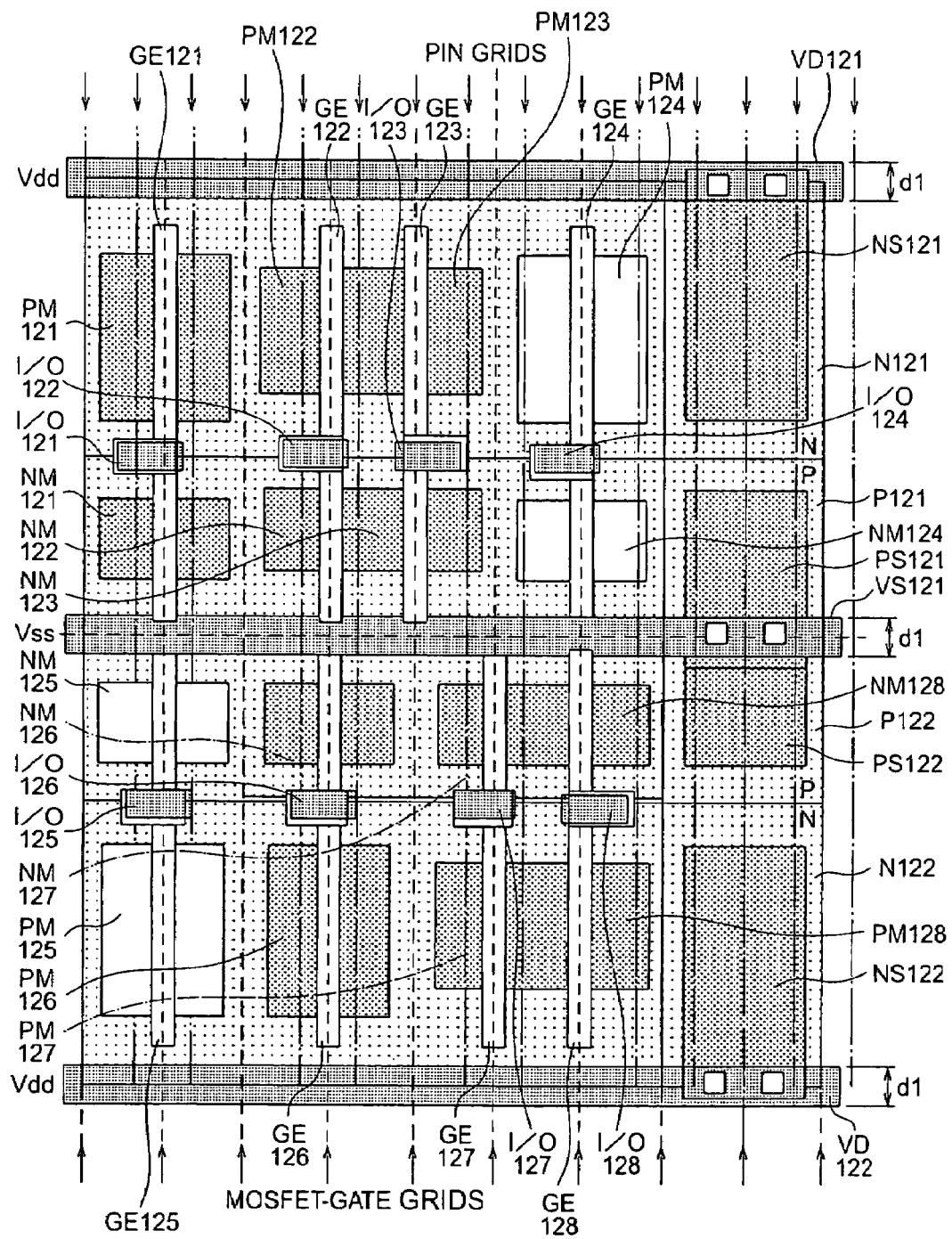
FIG. 3 is a plan view showing the arrangement of a semiconductor integrated circuit according to the third embodiment of the present invention.

FIG. 3 is a plan view showing the arrangement of a semiconductor integrated circuit according to this embodiment.

An N-type well region N121 and P-type well region P121 are placed in a surface portion of a semiconductor substrate. A power supply voltage Vdd line VD121 and ground voltage Vss line VS121 are placed above and below, respectively, in FIG. 3, the pair of the N-type well region N121 and P-type well region P121.

Another pair of a P-type well region P122 and N-type well region N122 are symmetrically placed with respect to the ground voltage Vss line VS121. A power supply voltage Vdd line VD122 is placed below, in FIG. 3, the N-type well region N122.

As in the first and second embodiments described above, pin grids as a reference of a metal pin pitch are indicated by the alternate long and short dashed lines, and gate grids as a reference of the pitch of the gate electrodes of MOS transistors are indicated by the dotted lines. The ratio of the pin grid pitch to the gate grid pitch is set at 2:3.

In the N-type well region N121, gate electrodes GE121, GE122, GE123, and GE124 are formed, and P-type diffusion layers are formed on the two sides of each of these gate electrodes to form PMOS transistors PM121, PM122, PM123, and PM124, respectively.

In the P-type well region P121, the gate electrodes GE121, GE122, GE123, and GE124 are so formed as to extend, and N-type diffusion layers are formed on the two sides of each of these gate electrodes to form NMOS transistors NM121, NM122, NM123, and NM124, respectively.

On the boundary line between the N-type well region N121 and P-type well region P121, input/output terminals I/O121 to I/O124 are so formed as to be connected to the gate electrodes GE121 to GE124, respectively.

Likewise, in the P-type well region P122, gate electrodes GE125 to GE128 are formed, and N-type diffusion layers are formed on the two sides of each of these gate electrodes to form NMOS transistors NM125 to NM128, respectively.

In the N-type well region N122, the gate electrodes GE125 to GE128 are so formed as to extend, and P-type diffusion layers are formed on the two sides of each of these gate electrodes to form PMOS transistors PM125 to PM128, respectively.

On the boundary line between the N-type well region N122 and P-type well region P122, input/output terminals I/O125 to I/O128 are so formed as to be connected to the gate electrodes GE125 to GE128, respectively.

Furthermore, as in the second embodiment described above, N-type impurity diffusion layers NS121 and NS122 for applying a power supply voltage Vdd to the N-type wells N121 and N122 and P-type impurity diffusion layers PS121 and PS122 for applying a ground voltage Vss to the P-type wells P121 and P122 are formed in the same cell region as the MOS transistors.

Similar to the first and second embodiments described above, the first characteristic feature of this embodiment is that the MOS transistors PM121 to PM128 and NM121 to NM128 forming the circuit are normalized when they are placed such that the gate electrodes GE121 to GE128 are placed on the gate grids.

This prevents differences between the gate electrodes of these MOS transistors placed in the vertical direction of FIG. 3. This eliminates the problem of phase contradiction which has conventionally occurred due to differences between the layouts of the gate electrodes of upper and lower MOS transistors when patterning is performed using photomasks. Accordingly, unlike in the conventional circuit, it is no longer necessary to place upper and lower MOS transistors with spacings between them by taking account of the phase contradiction. This realizes micropatterning.

Similar to the first and second embodiments described previously, the second characteristic feature of this embodiment is that the input/output terminals I/O121 to I/O128 formed between the plurality of MOS transistors are placed by taking account of differences between the gate grids and pin grids.

Furthermore, as in the second embodiment, the third characteristic feature of this embodiment is that the diffusion layers NS121, NS122, PS121, and PS122 for applying the substrate bias potential to the N-type wells N121 and N122 and the P-type wells P121 and P122 are formed as substrate potential setting cells in the region in which the MOS transistors are placed. This obviates the need to form any impurity diffusion layers for applying the substrate potential in the power supply voltage Vdd line VD121 and ground voltage Vss line VS121. Consequently, the width d1 can be made smaller than the conventional width d11, so micropatterning of elements is realized.

(4) Fourth Embodiment

Figure 4:
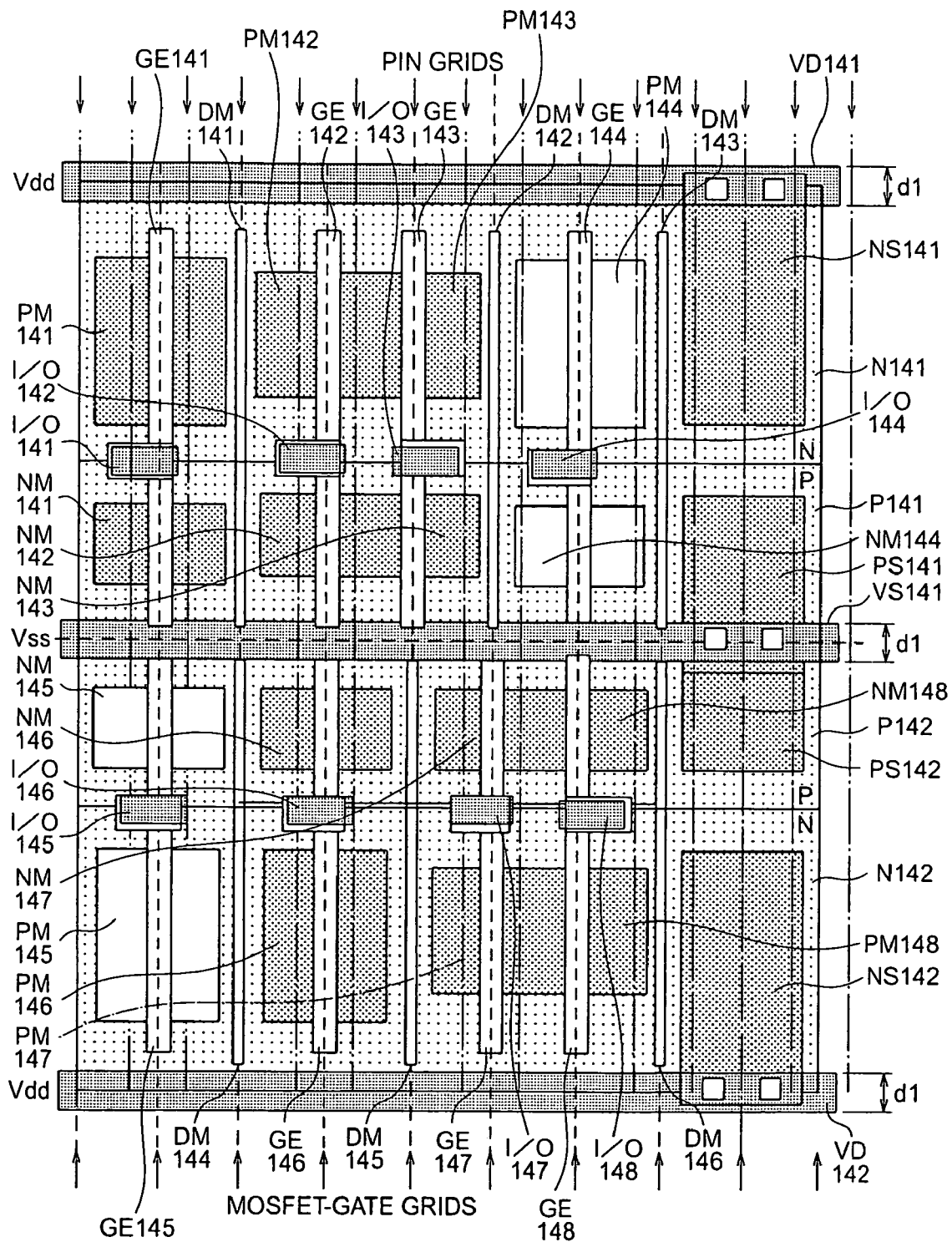
FIG. 4 is a plan view showing the arrangement of a semiconductor integrated circuit according to the fourth embodiment of the present invention.

The fourth embodiment of the present invention will be described below with reference to FIG. 4. This embodiment includes dummy gates between cells in addition to the arrangement of the third embodiment described above.

An N-type well region N141 and P-type well region P141 are placed in a surface portion of a semiconductor substrate. A power supply voltage Vdd line VD141 and ground voltage Vss line VS141 are placed above and below, respectively, in FIG. 4, the pair of the N-type well region N141 and P-type well region P141.

Another pair of a P-type well region P142 and N-type well region N142 are symmetrically placed with respect to the ground voltage Vss line VS141. A power supply voltage Vdd line VD142 is placed below, in FIG. 4, the N-type well region N142.

Pin grids are indicated by the alternate long and short dashed lines, and gate grids are indicated by the dotted lines. The ratio of the pin grid pitch to the gate grid pitch is set at 2:3.

In the N-type well region N141, gate electrodes GE141, GE142, GE143, and GE144 are formed, and P-type diffusion layers are formed on the two sides of each of these gate electrodes to form PMOS transistors PM141, PM142, PM143, and PM144, respectively.

In the P-type well region P141, the gate electrodes GE141, GE142, GE143, and GE144 are so formed as to extend, and N-type diffusion layers are formed on the two sides of each of these gate electrodes to form NMOS transistors NM141, NM142, NM143, and NM144, respectively.

On the boundary line between the N-type well region N141 and P-type well region P141, input/output terminals I/O141 to I/O144 are so formed as to be connected to the gate electrodes GE141 to GE144, respectively.

In the P-type well region P142, gate electrodes GE145 to GE148 are formed, and N-type diffusion layers are formed on the two sides of each of these gate electrodes to form NMOS transistors NM145 to NM148, respectively.

In the N-type well region N142, the gate electrodes GE145 to GE148 are so formed as to extend, and P-type diffusion layers are formed on the two sides of each of these gate electrodes to form PMOS transistors PM145 to PM148, respectively.

On the boundary line between the N-type well region N142 and P-type well region P142, input/output terminals I/O145 to I/O148 are so formed as to be connected to the gate electrodes GE145 to GE148, respectively.

N-type impurity diffusion layers NS141 and NS142 for applying a power supply voltage Vdd to the N-type wells N141 and N142 and P-type impurity diffusion layers PS141 and PS142 for applying a ground voltage Vss to the P-type wells P141 and P142 are placed in the same cell region as the MOS transistors.

Furthermore, a dummy gate electrode DM141 is placed between a cell made up of the PMOS transistor PM141 and NMOS transistor NM141 which share the gate electrode GE141 and a cell made up of the PMOS transistor PM142 and NMOS transistor NM142 which share the gate electrode GE142. A dummy gate electrode DM142 is placed between a cell made up of the PMOS transistor PM143 and NMOS transistor NM143 which share the gate electrode GE143 and a cell made up the PMOS transistor PM144 and NMOS transistor NM144 which share the gate electrode GE144. Also, a dummy gate electrode DM143 is placed between the cell made up of the PMOS transistor PM144 and NMOS transistor NM144 and the N- and P-type impurity diffusion layers NS141 and PS141.

Likewise, a dummy gate electrode DM144 is placed between a cell made up of the PMOS transistor PM145 and NMOS transistor NM145 and a cell made up the PMOS transistor PM146 and NMOS transistor NM146. A dummy gate electrode DM145 is placed between the cell made up of the PMOS transistor PM146 and NMOS transistor NM146 and a cell made up the PMOS transistor PM147 and NMOS transistor NM147. A dummy gate electrode DM146 is placed between a cell made up of the PMOS transistor PM148 and NMOS transistor NM148 and the N- and P-type impurity diffusion layers NS142 and PS142.

In addition to the first to third characteristic features of the third embodiment described above, the fourth embodiment has the fourth characteristic feature that the dummy gates formed between the adjacent cells make the MOS transistor gate placement more uniform, and improve the accuracy of processing.

(5) Fifth Embodiment

The fifth embodiment of the present invention will be described below.

In the first to fourth embodiments described above, the power supply voltage Vdd is applied to the N-type well, and the ground voltage Vss is applied to the P-type well.

Figure 5:
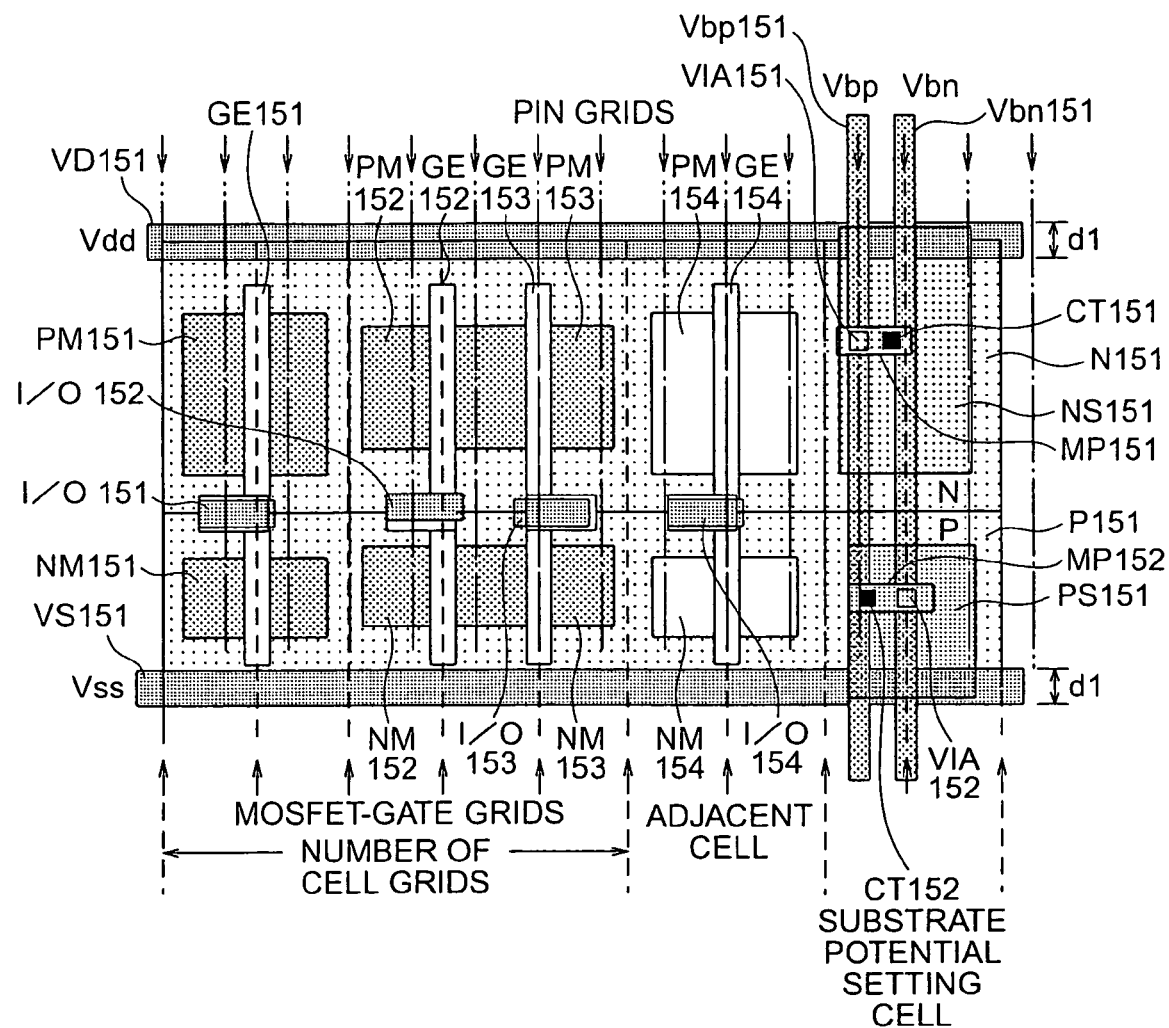
FIG. 5 is a plan view showing the arrangement of the fifth embodiment of the present invention, in which a substrate potential different from a power supply voltage Vdd is applied to an N-type well, and a substrate potential different from a ground voltage Vss is applied to a P-type well.

This embodiment differs from the above embodiments in that a substrate potential different from the power supply voltage Vdd is applied to an N-type well, and a substrate potential different from the ground voltage Vss is applied to a P-type well. An example of this arrangement is the fifth embodiment of the present invention, and the arrangement is shown in FIG. 5.

An N-type well region N151 and P-type well region P151 are placed in a surface portion of a semiconductor substrate. A power supply voltage Vdd line VD151 and ground voltage Vss line VS151 are placed along one direction (the horizontal direction in FIG. 5) above and below, respectively, in FIG. 5, the pair of the N-type well region N151 and P-type well region P151.

In addition, substrate potential supply cells for applying a substrate voltage Vbp different from a power supply voltage Vdd to the N-type well N151 and a substrate voltage Vbn different from a ground voltage Vss to the P-type well P151 are formed in the same cell region as MOS transistors. That is, an N-type impurity diffusion layer NS151 is formed in the N-type well N151, and a P-type impurity diffusion layer PS151 is formed in the P-type well P151.

Furthermore, in a direction (vertical direction in FIG. 5) perpendicular to the power supply voltage Vdd line VD151 and ground voltage Vss line VS151, a substrate voltage Vbp line Vbp151 and substrate voltage Vbn line Vbn151 are placed in an interconnection layer above the power supply voltage Vdd line VD151 and ground voltage Vss line VS151 in accordance with pin grids.

The N-type impurity diffusion layer NS151 is electrically connected to the substrate voltage Vbp line Vbp151, and the P-type impurity diffusion layer PS151 is electrically connected to the substrate voltage Vbn line Vbn151.

As in the first to fourth embodiments described above, pin grids as a reference of a metal pin pitch are indicated by the alternate long and short dashed lines in the vertical direction of FIG. 5, and gate grids as a reference of the pitch of the gate electrodes of MOS transistors are indicated by the dotted lines. In this embodiment, as in the above embodiments, the ratio of the pin grid pitch to the gate grid pitch is set at 2:3.

In the N-type well region N151, a gate electrode GE151 is formed on the substrate, and P-type diffusion layers are formed on the two sides of this gate electrode to form a PMOS transistor PM151. Similarly, gate electrodes GE152, GE153, and GE154 are formed, and P-type diffusion layers are formed on the two sides of each of these gate electrodes to form PMOS transistors PM152, PM133, and PM154, respectively.

In the P-type well region P151, the gate electrodes GE151, GE152, GE153, and GE154 are so formed as to extend, and N-type diffusion layers are formed on the two sides of each of these gate electrodes to form NMOS transistors NM151, NM152, NM153, and NM154, respectively.

As in the second embodiment, a cell made up of the PMOS transistor PM154 and NMOS transistor NM154 is formed adjacent to cells made up of the PMOS transistor PM151 and NMOS transistor NM151, the PMOS transistor PM152 and NMOS transistor NM152, and the PMOS transistor PM153 and NMOS transistor NM153.

On the boundary line between the N-type well region N151 and P-type well region P151, input/output terminals I/O151 to I/O154 are so formed as to be connected to the gate electrodes GE151 to GE154, respectively.

The MOS transistors PM151 to PM154 and NM151 to NM154 forming the circuit are normalized when they are placed such that the gate electrodes GE151 to GE154 are placed on the gate grids.

Also, the input/output terminals I/O151 to I/O154 formed between the plurality of MOS transistors are placed by taking account of differences between the gate grids and pin grids.

Furthermore, unlike in the first to fourth embodiments, to apply the substrate voltage Vbp different from the power supply voltage Vdd and the substrate voltage Vbn different from the ground voltage Vss, the substrate voltage Vbp line Vbp151 and substrate voltage Vbn line Vbn151 are connected to the diffusion layers NS151 and PS151 for applying the substrate bias voltage to the N-type well N151 and P-type well P151, respectively.

A metal interconnection MP151 in the first layer is connected to the diffusion layer NS151 by a contact CT151, and the metal interconnection MP151 is connected to the substrate voltage Vbp line Vbp151 in the second layer by a via hole VIA151. Likewise, a metal interconnection MP152 in the first layer is connected to the diffusion layer PS151 by a contact CT152, and the metal interconnection MP152 is connected to the substrate voltage Vbn line Vbn151 in the second layer by a via hole VIA152.

Similar to the above embodiments, this embodiment having the above arrangement can increase the cell placement efficiency and contribute to micropatterning.

(6) Sixth Embodiment

Figure 6:
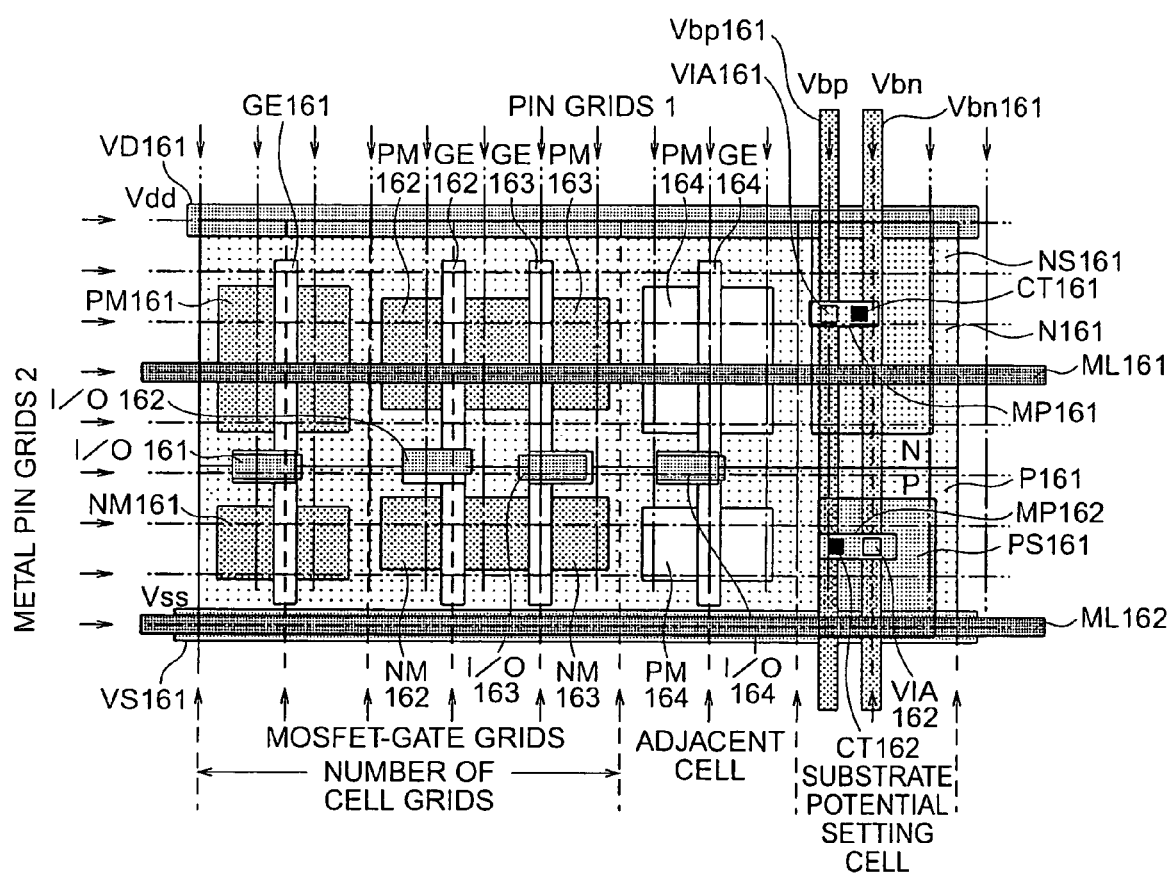
FIG. 6 is a plan view showing the arrangement of the sixth embodiment of the present invention, in which metal interconnections are placed in the third layer.

The sixth embodiment of the present invention will be described below with reference to FIG. 6.

In each of the first to fourth embodiments described previously, a plurality of MOS transistors forming the circuit are normalized when they are placed such that their gate electrodes are placed on the gate grids.

In addition, in each of the above embodiments, metal interconnections are formed on the pin grids by normalization. FIG. 6 shows a practical placement of the metal interconnections.

As in the fifth embodiment, a power supply voltage Vdd line VD161 and ground voltage Vss line VS161 are placed along one direction as a first interconnection layer. In a direction perpendicular to this direction, a substrate voltage Vbp line Vbp161 and substrate voltage Vbn line Vbn161 are placed as a second interconnection layer in accordance with pin grids 1. The same reference numerals as in the fifth embodiment denote the same elements, and a detailed explanation thereof will be omitted.

In this embodiment, pin grids 2 are additionally formed in a direction perpendicular to the pin grids 1. The pin grids 1 and pin grids 2 can have the same interconnection pitch or different interconnection pitches.

In accordance with the pin grids 2, metal interconnections ML161 and ML162 are placed as a third interconnection layer.

In this embodiment, the pin grids 1 and gate grids are set in the same direction, the gates of MOS transistors are placed in accordance with the gate grids, input/output terminals are placed by taking account of the gate grids and pin grids, and the second interconnection layer is placed in accordance with the pin grids 1.

In addition, the pin grids 2 are set in the direction perpendicular to the pin grids 1 and gate grids, and the third interconnection layer is placed in accordance with the pin grids 2. Since this placement increases the cell placement efficiency, the element area can be reduced.

Each of the above embodiments is merely an example and hence does not limit the present invention, so each embodiment can be variously modified without departing from the technical scope of the present invention. For example, in each of the above embodiments, the ratio of the pin grid pitch to the gate grid pitch is set at 2:3. However, this ratio can be set at any arbitrary value.

In the semiconductor integrated circuits and the methods of designing the same according to the above embodiments, the gate grids and pin grids are set in the cell region, the gate electrodes of MOS transistors are placed in accordance with the gate grids, and metal interconnections are placed in accordance with the pin grids. This increases the cell placement efficiency.

What is claimed is:

1. A method of designing a semiconductor integrated circuit, comprising:
   providing a cell region in which a plurality of MOS transistors forming at least one cell are placed, setting gate grids for defining a first pitch in one direction and pin grids for defining a second pitch in the one direction;
   placing first and second power lines along the one direction in a peripheral portion of the cell region;
   placing the MOS transistors such that gate electrodes are positioned on the gate grids; and
   placing an interconnection layer in accordance with the pin grids.

2. A method according to claim 1, further comprising, placing an input/output terminal to be connected to the gate electrode of the MOS transistor such that, if a gate grid at which the gate electrode is positioned is not aligned with the pin grids, the input/output terminal is placed so as to extend over the gate grid and one of the pin grids adjacent to the gate grid.

3. A method according to claim 1, further comprising, placing, in the cell region, an impurity diffusion layer for fixing a potential of a well in the cell region.

4. A method according to claim 1, wherein an impurity diffusion layer is connected to the first or second power line when placed.

5. A method according to claim 1, further comprising, placing third and fourth power lines having a potential different from the first and second power lines,
   wherein an impurity diffusion layer is connected to the third or fourth power line.

6. A method according to claim 1, wherein when at least two cells are placed in the cell region,
   the method further comprises placing a dummy gate between the cells.

7. A method according to claim 1, further comprising:
   setting, in the cell region, second pin grids for defining a third pitch in another direction perpendicular to the one direction; and
   placing another interconnection layer in accordance with the second pin grids.

* * * * *